(12) United States Patent
Pesach et al.

(10) Patent No.: US 10,690,488 B2
(45) Date of Patent: *Jun. 23, 2020

(54) PROJECTORS OF STRUCTURED LIGHT

(71) Applicant: APPLE INC., Cupertino, CA (US)

(72) Inventors: Benny Pesach, Rosh Haayin (IL);
Zafrir Mor, Ein Habsor (IL)

(73) Assignee: APPLE INC., Cupertino, CA (US)

( * ) Notice: Subject to any disclaimer, the term of this patent is extended or adjusted under 35 U.S.C. 154(b) by 144 days.

This patent is subject to a terminal disclaimer.

(21) Appl. No.: 15/953,460

(22) Filed: Apr. 15, 2018

(65) Prior Publication Data

US 2018/0231373 A1    Aug. 16, 2018

Related U.S. Application Data

(63) Continuation of application No. 15/265,877, filed on Sep. 15, 2016, which is a continuation of application
(Continued)

(51) Int. Cl.
*G01B 11/25* (2006.01)
*G06T 7/521* (2017.01)
(Continued)

(52) U.S. Cl.
CPC .......... *G01B 11/2513* (2013.01); *G01B 11/25* (2013.01); *G02B 27/106* (2013.01);
(Continued)

(58) Field of Classification Search
CPC ..... G01B 11/25; G01B 11/2513; H01S 5/423; H01S 5/005
(Continued)

(56) References Cited

U.S. PATENT DOCUMENTS 5,325,386 A    6/1994  Jewell et al.
5,774,219 A *  6/1998  Matsuura ................. G01D 5/38
                                                      250/237 G
(Continued)

FOREIGN PATENT DOCUMENTS

CN    101267086 A    9/2008
CN    102611002 A    7/2012
(Continued)

OTHER PUBLICATIONS

TW Application # 107129761 office action dated Apr. 8, 2019.
(Continued)

*Primary Examiner* — Tu T Nguyen
(74) *Attorney, Agent, or Firm* — Kligler & Associates Patent Attorneys Ltd

(57) ABSTRACT

An optoelectronic device includes a semiconductor substrate and a monolithic array of light-emitting elements, including first and second sets of the light-emitting elements arranged on the substrate in respective first and second two-dimensional patterns, which are interleaved on the substrate. First and second conductors are respectively connected to separately drive the first and second sets of the light-emitting elements so that the device selectably emits light in either or both of the first and second patterns.

20 Claims, 9 Drawing Sheets

Related U.S. Application Data

No. 14/242,895, filed on Apr. 2, 2014, now abandoned, which is a continuation of application No. 13/567,095, filed on Aug. 6, 2012, now Pat. No. 8,749,796.

(60) Provisional application No. 61/521,406, filed on Aug. 9, 2011, provisional application No. 61/611,075, filed on Mar. 15, 2012.

(51) Int. Cl.
*H01S 5/00* (2006.01)
*H01S 5/42* (2006.01)
*G02B 27/10* (2006.01)

(52) U.S. Cl.
CPC .......... *G02B 27/1086* (2013.01); *G06T 7/521* (2017.01); *H01S 5/005* (2013.01); *H01S 5/423* (2013.01); *H01L 2224/48091* (2013.01)

(58) Field of Classification Search
USPC .......................................................... 356/610
See application file for complete search history.

(56) References Cited

U.S. PATENT DOCUMENTS

| | | | |
|---|---|---|---|
| 5,784,396 | A | 7/1998 | Guerin |
| 6,002,705 | A | 12/1999 | Thornton |
| 6,026,110 | A | 2/2000 | Makino |
| 6,222,868 | B1 | 4/2001 | Ouchi et al. |
| 6,281,867 | B2 | 8/2001 | Kurematsu et al. |
| 6,798,438 | B2 | 9/2004 | Beier et al. |
| 2002/0153422 | A1* | 10/2002 | Tsikos ................ G06K 7/10742 235/454 |
| 2003/0021326 | A1 | 1/2003 | Liao et al. |
| 2004/0011457 | A1* | 1/2004 | Kobayashi .......... B29C 65/1467 156/272.2 |
| 2005/0152146 | A1 | 7/2005 | Owen et al. |
| 2007/0273957 | A1 | 11/2007 | Zalevsky et al. |
| 2008/0205462 | A1 | 8/2008 | Uchida |
| 2008/0279241 | A1 | 11/2008 | Oki et al. |
| 2009/0010297 | A1 | 1/2009 | Uchida |
| 2010/0311502 | A1 | 12/2010 | Miller et al. |
| 2012/0249743 | A1 | 10/2012 | Kim et al. |
| 2012/0293625 | A1 | 11/2012 | Schneider et al. |
| 2013/0039374 | A1 | 2/2013 | Lutgen et al. |
| 2014/0199844 | A1 | 7/2014 | Palmer |
| 2014/0354367 | A1 | 12/2014 | Suzuki et al. |
| 2015/0260830 | A1 | 9/2015 | Ghosh et al. |
| 2016/0072258 | A1 | 3/2016 | Seurin et al. |
| 2016/0164261 | A1 | 6/2016 | Warren |

FOREIGN PATENT DOCUMENTS

| | | |
|---|---|---|
| CN | 105048282 A | 11/2015 |
| JP | 2000114656 A | 4/2000 |
| JP | 2011003748 A | 1/2011 |
| JP | 2011228553 A | 11/2011 |
| KR | 1020070018805 A | 2/2007 |
| WO | 2009153446 A2 | 12/2009 |
| WO | 2015078857 A1 | 6/2015 |

OTHER PUBLICATIONS

U.S. Appl. No. 15/648,473 office action dated Jun. 24, 2019.
KR Application # 10-2013-0023877 office action dated Jul. 31, 2019.
U.S. Appl. No. 15/844,662 office action dated Apr. 2, 2018.
International Application PCT/US2018/040531 Search report dated Nov 8, 2018.
KR Application # 10-2013-0023877 office action dated Jan. 22, 2019.
CN Application # 201821292011.1 Utility Model Patent Evaluation Report (UMPER) dated Sep. 16, 2019.
U.S. Appl. No. 16/524,313 office action dated Nov. 22, 2019.
CN Utility Model Patent # 201821292011.1 Notification of Review Opinions on Patentability Evaluation Report dated Dec. 2, 2019.
EP Patent Application # 19189860.0 Extended Search Report dated Nov. 27, 2019.
CN Application # 201811355978.4 Office Action dated Apr. 27, 2020.

* cited by examiner

PROJECTORS OF STRUCTURED LIGHT

CROSS-REFERENCE TO RELATED APPLICATIONS

This application is a continuation of U.S. patent application Ser. No. 15/265,877, filed Sep. 15, 2016, which is a continuation of U.S. patent application Ser. No. 14/242,895, filed Apr. 2, 2014, which is a continuation of U.S. patent application Ser. No. 13/567,095, filed Aug. 6, 2012, which claims the benefit of U.S. Provisional Patent Application 61/521,406, filed Aug. 9, 2011, and U.S. Provisional Patent Application 61/611,075, filed Mar. 15, 2012. Both of these related applications are incorporated herein by reference.

FIELD OF THE INVENTION

The present invention relates generally to optical and optoelectronic devices, and specifically to devices for projection of patterns.

BACKGROUND OF THE INVENTION

Compact optical projectors are used in a variety of applications. For example, such projectors may be used to cast a pattern of coded or structured light onto an object for purposes of three-dimensional (3D) mapping (also known as depth mapping). In this regard, U.S. Patent Application Publication 2008/0240502, whose disclosure is incorporated herein by reference, describes an illumination assembly in which a light source, such as a laser diode or LED, transilluminates a transparency with optical radiation so as to project a pattern onto the object. (The terms "optical" and "light" as used in the present description and in the claims refer generally to any and all of visible, infrared, and ultraviolet radiation.) An image capture assembly captures an image of the pattern that is projected onto the object, and a processor processes the image so as to reconstruct a 3D map of the object.

PCT International Publication WO 2008/120217, whose disclosure is incorporated herein by reference, describes further aspects of the sorts of illumination assemblies that are shown in the above-mentioned US 2008/0240502. In one embodiment, the transparency comprises an array of micro-lenses arranged in a non-uniform pattern. The micro-lenses generate a corresponding pattern of focal spots, which is projected onto the object.

Optical projectors may, in some applications, project light through one or more diffractive optical elements (DOEs). For example, U.S. Patent Application Publication 2009/0185274, whose disclosure is incorporated herein by reference, describes apparatus for projecting a pattern that includes two DOEs that are together configured to diffract an input beam so as to at least partially cover a surface. The combination of DOEs reduces the energy in the zero-order (undiffracted) beam. In one embodiment, the first DOE generates a pattern of multiple beams, and the second DOE serves as a pattern generator to form a diffraction pattern on each of the beams. A similar sort of arrangement is described in U.S. Patent Application Publication 2010/0284082, whose disclosure is also incorporated herein by reference.

As another example, U.S. Patent Application Publication 2011/0188054, whose disclosure is incorporated herein by reference, describes photonics modules that include optoelectronic components and optical elements in a single integrated package. In one embodiment, an integrated photonics module (IPM) comprises radiation sources in the form of a two-dimensional matrix of optoelectronic elements, which are arranged on a substrate and emit radiation in a direction perpendicular to the substrate. Such an IPM typically comprises multiple, parallel rows of emitters, such as light-emitting diodes (LEDs) or vertical-cavity surface-emitting laser (VCSEL) diodes, forming a grid in the X-Y plane. The radiation from the emitters is directed into an optical module, comprising a suitable patterned element and a projection lens, which projects the resulting pattern onto a scene.

SUMMARY OF THE INVENTION

Embodiments of the present invention that are described hereinbelow provide improved devices and methods for projection of patterned light.

There is therefore provided, in accordance with an embodiment of the present invention, optical apparatus, including a beam source, which is configured to generate an optical beam having a pattern imposed thereon. A projection lens is configured to receive and project the optical beam so as to cast the pattern onto a first area in space having a first angular extent. A field multiplier is interposed between the projection lens and the first area and is configured to expand the projected optical beam so as to cast the pattern onto a second area in space having a second angular extent that is at least 50% greater than the first angular extent.

Typically, the second angular extent is at least twice the first angular extent.

The apparatus may include a reflective surface interposed so as to fold the projected optical beam between the projection lens and the field multiplier.

In some embodiments, the field multiplier includes a diffractive optical element (DOE). The DOE is typically configured to expand the projected optical beam by producing multiple, mutually-adjacent tiles on the second area, each tile containing a respective replica of the pattern. In disclosed embodiments, the DOE is configured to generate a two-dimensional array of the tiles. The tiles have a pitch, and in one embodiment, at least some of the tiles are offset transversely relative to neighboring tiles by an offset that is a fraction of the pitch.

In other embodiments, the field multiplier includes a prism. Typically, the prism has an edge and is positioned so that the optical beam projected by the projection lens is incident on the edge. In one embodiment, the prism has a triangular profile with a vertex angle that is greater than 90° at the edge upon which the projected optical beam is incident. Alternatively or additionally, the field multiplier may include first and second prisms, having respective first and second edges and having respective first and second bases opposite the first and second edges, wherein the first and second bases are joined together while the first and second prisms are rotated so that the first and second edges opposite the bases are mutually perpendicular. Further alternatively or additionally, the prism may have a pyramidal shape with an apex and is positioned so that the optical beam projected by the projection lens is incident on the apex. The prism may include an internal reflective surface configured to fold the projected optical beam.

In some embodiments, the beam source includes a light source, which emits the optical beam, and a patterning element, which is interposed in the optical beam emitted by the light source. In other embodiments, the beam source includes a monolithic array of light-emitting elements, arranged on a semiconductor substrate in a two-dimensional pattern corresponding to the pattern imposed on the optical beam.

There is also provided, in accordance with an embodiment of the present invention, an optoelectronic device, including a semiconductor substrate and a monolithic array of light-emitting elements, arranged on the substrate in a two-dimensional pattern that is not a regular lattice.

In a disclosed embodiment, the light-emitting elements include vertical-cavity surface-emitting laser (VCSEL) diodes.

In some embodiments, the two-dimensional pattern of the light-emitting elements is an uncorrelated pattern.

In one embodiment, the light-emitting elements include first and second sets of the light-emitting elements, wherein the first and second sets are interleaved on the substrate in respective first and second patterns, and wherein the device includes first and second conductors, which are respectively connected to separately drive the first and second sets of the light-emitting elements so that the device selectably emits light in either or both of the first and second patterns. The device may further include projection optics, which are configured to project the light emitted by the light emitting elements onto an object, and an imaging device, which is configured to capture images of the object in a low-resolution mode while only the first set of the light-emitting elements is driven to emit the light, thereby projecting a low-resolution pattern onto the object, and in a high-resolution mode while both of the first and second sets of the light-emitting elements are driven to emit the light, thereby projecting a high-resolution pattern onto the object.

In some embodiments, the device includes a projection lens, which is mounted on the semiconductor substrate and is configured to collect and focus light emitted by the light-emitting elements so as to project an optical beam containing a light pattern corresponding to the two-dimensional pattern of the light-emitting elements on the substrate. The device may also include a diffractive optical element (DOE), which is mounted on the substrate and is configured to expand the projected optical beam by producing multiple, mutually-adjacent replicas of the pattern. The projection lens and the DOE may be formed on opposing sides of a single optical substrate.

Alternatively, the device includes a single diffractive optical element (DOE), which is mounted on the semiconductor substrate and is configured to collect and focus light emitted by the light-emitting elements so as to project an optical beam containing a light pattern corresponding to the two-dimensional pattern of the light-emitting elements on the substrate while expanding the projected optical beam by producing multiple, mutually-adjacent replicas of the pattern.

There is additionally provided, in accordance with an embodiment of the present invention, a method for pattern projection, which includes generating an optical beam having a pattern imposed thereon. The optical beam is projected using a projection lens so as to cast the pattern onto a first area in space having a first angular extent. A field multiplier is applied to expand the optical beam projected by the projection lens so as to cast the pattern onto a second area in space having a second angular extent that is at least 50% greater than the first angular extent.

There is further provided, in accordance with an embodiment of the present invention, a method for producing an optoelectronic device. The method includes providing a semiconductor substrate and forming a monolithic array of light-emitting elements on the substrate in a two-dimensional pattern that is not a regular lattice.

The present invention will be more fully understood from the following detailed description of the embodiments thereof, taken together with the drawings in which:

DETAILED DESCRIPTION OF EMBODIMENTS

Overview

Figure 1:
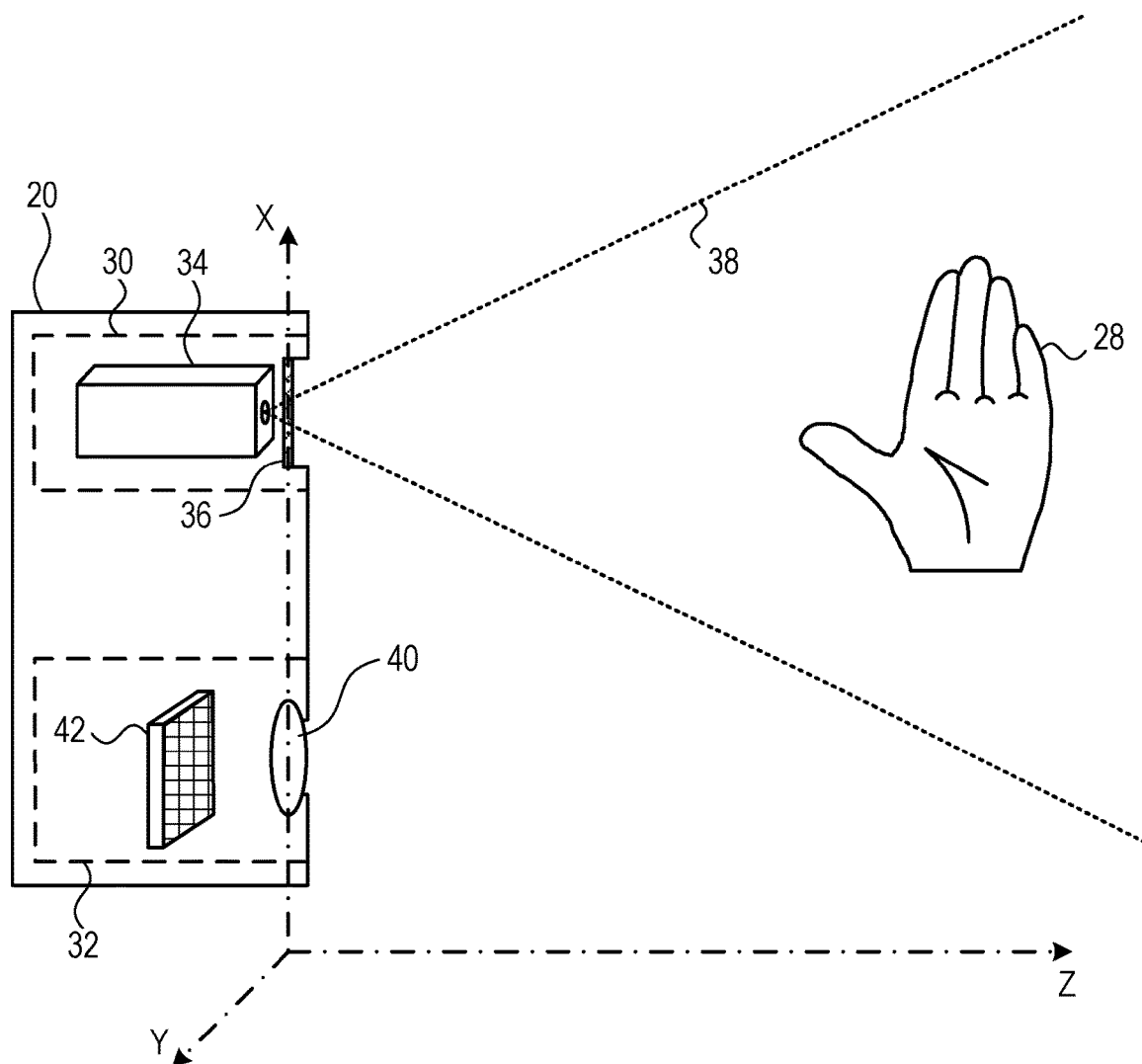
FIG. 1 is a schematic side view of a 3D mapping system, in accordance with an embodiment of the present invention.

In many optical projection applications, a pattern must be projected over a wide angular range. For example, in the sort of 3D mapping applications that are described above in the Background section, it is often desirable that the pattern of light that is used to create the map be projected over a field of 90° or more. In conventional optical designs, achieving reasonable optical quality over such a wide field of view (FOV) requires the use of costly, multi-element projection optics. Both the cost and the size of such optics can be prohibitive for consumer applications, which generally require compact, inexpensive solutions.

Some embodiments of the present invention that are described hereinbelow address these demands by means of a field multiplier, which follows the projection optics in the optical train and expands the field over which a desired pattern is projected, while maintaining the optical quality of the projected pattern. The addition of the field multiplier makes it possible to project a pattern over a wide area using compact, inexpensive projection optics, which themselves have a relatively narrow FOV.

In the disclosed embodiments, optical apparatus comprises a beam source, which generates a patterned optical beam. A projection lens projects the patterned optical beam and would, in the absence of the field multiplier, cast the pattern onto a given area in space having a certain angular extent, corresponding to the field of view (FOV) of the projection lens. (The term "lens," as used in the context of the present description and in the claims, refers to both simple and compound, multi-element lenses unless explicitly stated otherwise.) The field multiplier is interposed in the FOV of the projection lens—between the lens and the given area in space—and expands the projected beam so that the pattern is cast onto an area in space having an angular extent that is at least 50% greater than the FOV of the projection lens. Depending on design, the expanded beam following the field multiplier can have twice the FOV of the projection lens, or even more.

The use of a field multiplier in the manner described above also makes it possible to interpose a reflective surface between the projection lens and the field multiplier, thus folding the projected optical beam. In this configuration, the axis of the beam source and projection optics may be oriented perpendicular to the axis of the expanded, projected beam. The option of folding the beam in this manner can be useful in applications in which space is at a premium.

The field multiplier may be implemented in various different ways, which are described in detail hereinbelow. For example, the field multiplier may comprise a diffractive optical element (DOE) or a prism.

In some embodiments, the beam source comprises a light source, which emits the optical beam, and a patterning element, such as a microlens array, which is interposed in the optical beam emitted by the light source. In other embodiments, the beam source comprises a monolithic array of light-emitting elements, which are arranged on a semiconductor substrate in a two-dimensional pattern corresponding to the pattern to be imposed on the optical beam.

System Description

FIG. 1 is a schematic side view of a 3D mapping system 20, in accordance with an embodiment of the present invention. System 20 is described here as an example of the use of the sorts of field multipliers that are described below, and not by way of limitation. The principles of the present invention may similarly be applied in other sorts of optical projection systems that require a wide FOV and can benefit from the advantages of compactness and low cost that are offered by the disclosed embodiments.

System 20 comprises a projection assembly 30, which projects a patterned beam 38 onto the surface of an object 28—in this example the hand of a user of the system. An imaging assembly 32 captures an image of the projected pattern on the surface and processes the image so as to derive a 3D map of the surface. For this purpose, assembly 32 typically comprises objective optics 40 and an image sensor 42, which captures the image, as well as a digital processor (not shown), which processes the image to generate the 3D map. Details of the image capture and processing aspects of system 20 are described, for example, in the above-mentioned U.S. Patent Application Publication 2010/0118123, as well as in U.S. Patent Application Publication 2010/0007717, whose disclosure is incorporated herein by reference.

Projection assembly 30 comprises a patterned beam generator 34, which projects a patterned illumination beam with a certain FOV, and a field multiplier 36, which expands the projected beam to created patterned beam 38 with a wider FOV. In this example, the pattern comprises high-contrast light spots on a dark background, in a random or quasi-random arrangement, as explained in the above-mentioned patent application publications. Alternatively, any other suitable type of pattern (including images) may be projected in this fashion.

Figure 2:
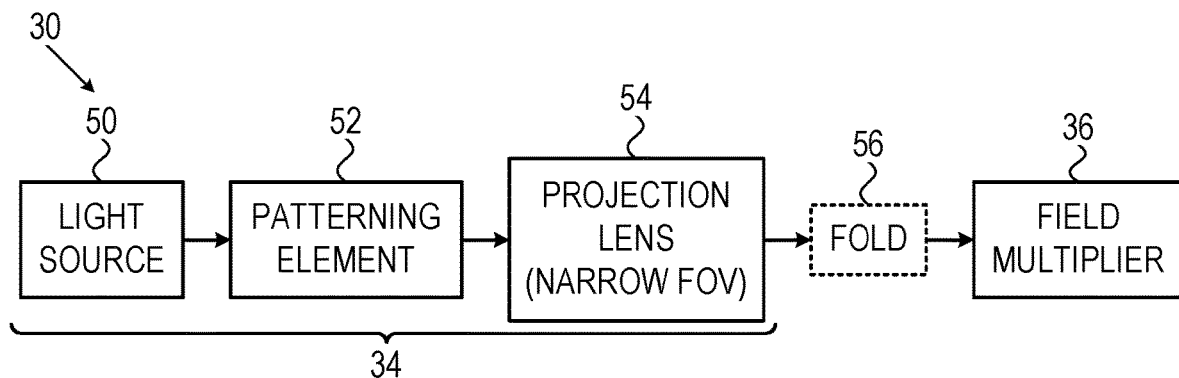
FIG. 2 is a block diagram that schematically illustrates a projection assembly, in accordance with an embodiment of the present invention.

FIG. 2 is a block diagram that schematically illustrates functional components of projection assembly 30, in accordance with an embodiment of the present invention. Assembly 30 comprises a beam source, which generates an optical beam having a pattern imposed on it.

In this embodiment, the beam source comprises a number of separate elements, including a light source 50, which produces an unpatterned beam, and a patterning element 52, which imposes the desired pattern on the beam. Patterning element 52 may comprise, for example, a transparency containing the desired pattern; or a microlens array, in which the microlenses are disposed on a transparent substrate in a non-uniform arrangement corresponding to the desired pattern; or a suitable diffractive optical element (DOE); or any other suitable patterning element that is known in the art. In alternative embodiments, as shown below in FIG. 8, for example, the beam source may comprise a non-uniform array of light sources, which are disposed on a substrate in an arrangement corresponding to the desired pattern (in which case the functions of light source 50 and patterning element 52 are embodied together in a single, integrated device).

A projection lens 54 receives and projects the patterned beam from the beam source, thus generating a projected beam with a narrow FOV, of angular extent 2w (wherein w is the half field angle and "narrow" is relative to the greater FOV of patterned beam 38). Optionally, a beam folder 56, typically comprising a reflective surface, is interposed so as to fold the projected optical beam that is output by lens 54. Folder 56 typically turns the beam axis by 90°, but may alternatively be configured for larger or smaller folding angles. A field multiplier 36 expands the projected beam to give the greater FOV, of angular extent $2\omega'$, of patterned output beam 38.

Diffractive Field Multipliers

Figure 3A:
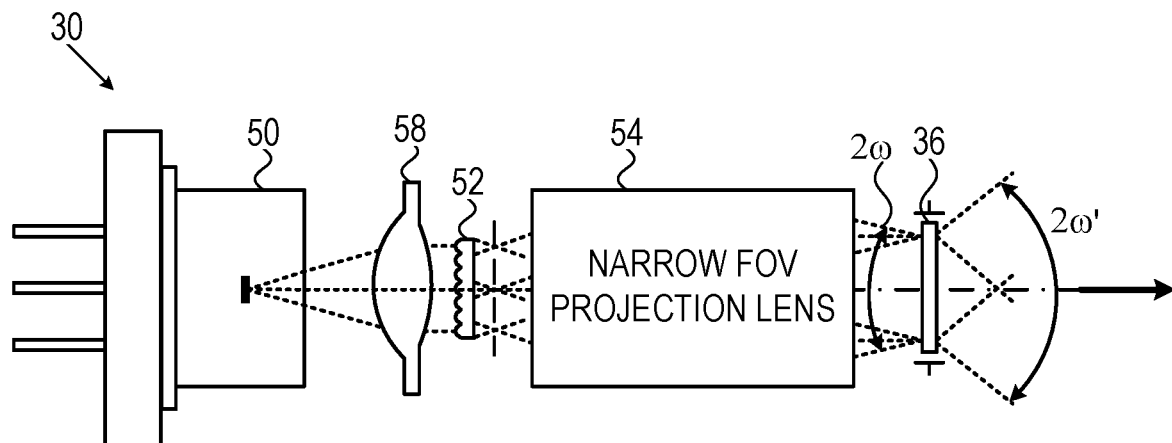
FIGS. 3A and 3B are schematic side views of projection assemblies, in accordance with embodiments of the present invention.
Figure 3B:
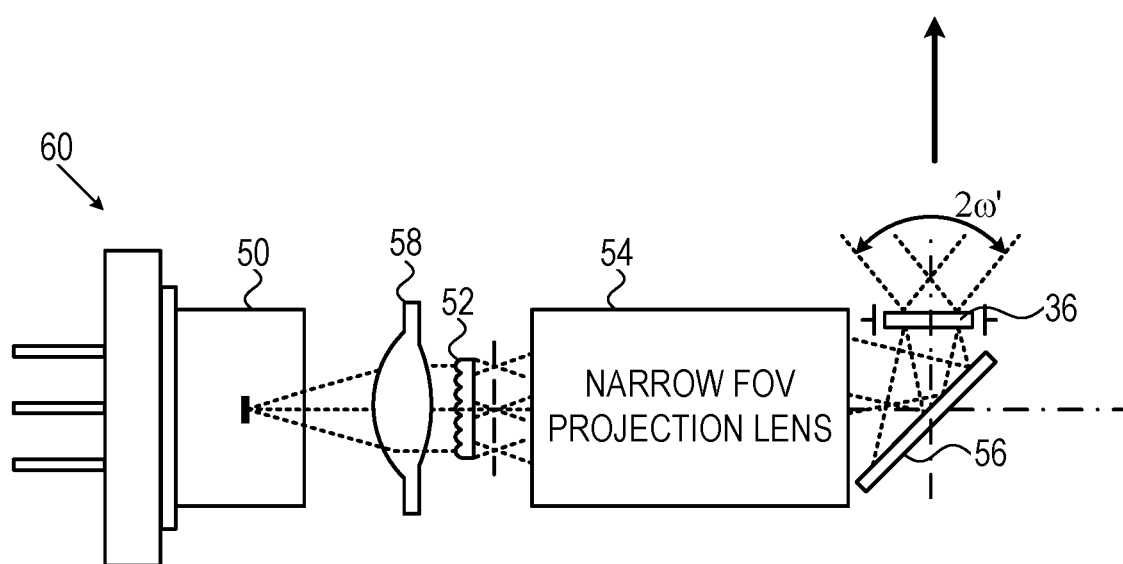

Reference is now made to FIGS. 3A and 3B, which are schematic side views of projection assembly 30, in accordance with two embodiments of the present invention. The embodiments are largely similar to one another, except that the embodiment of FIG. 3B includes a mirror serving as beam folder 56 interposed between projection lens 54 and field multiplier 36. The field multiplier in both embodiments comprises a diffractive optical element (DOE), which is positioned in the exit pupil of lens 54. This location of field multiplier 36 is useful in reducing the required size of the DOE.

Light source 50 in these embodiments comprises, by way of example, a laser diode or light-emitting diode (LED), or an array of such diodes, in an integrated package. A collection lens 58 collimates the light emitted by the light source, and this collimated light transilluminates patterning element 52, which in this embodiment comprises a microlens array. The microlens array creates a non-uniform pattern of focal spots in its rear focal plane, and this pattern is projected by projection lens 54.

The pattern projected by projection lens 54 is multiplied by the DOE, which creates multiple, mutually-adjacent tiles, each containing a respective replica of the original pattern produced by patterning element 52. Typically, the DOE generates a two-dimensional array of $M_x \times M_y$ mutually-adjacent tiles. The multiplication parameters ($M_x$, $M_y$) may be chosen as a compromise between the diffraction efficiency, diffraction zero-order intensity, optical design of the projection lens, and geometrical considerations.

The FOV of the expanded beam transmitted by DOE field multiplier 36 may be calculated using the grating equation, $\sin \omega' = M \sin \omega$, which gives the following FOV of beam 38:

$$2\omega'_x = 2 arc \sin(M_x \sin \omega_x)$$

$$2\omega'_y = 2 arc \sin(M_y \sin \omega_y)$$

For example, a 3×3 DOE field multiplier can generate an output FOV of 80°×60°, using projection lens 54 with FOV of about 25°×19°. The spatial periods ($d_x$, $d_y$) in the X and Y directions of a DOE made for this purpose may be calculated from the following expressions:

$$d_x = \frac{\lambda}{2\sin\omega_x} = \frac{\lambda M_x}{2\sin\omega'_x};$$

$$d_y = \frac{\lambda}{2\sin\omega_y} = \frac{\lambda M_y}{2\sin\omega'_y}$$

wherein $\lambda$ is the wavelength of light source 50.

Figure 9A:
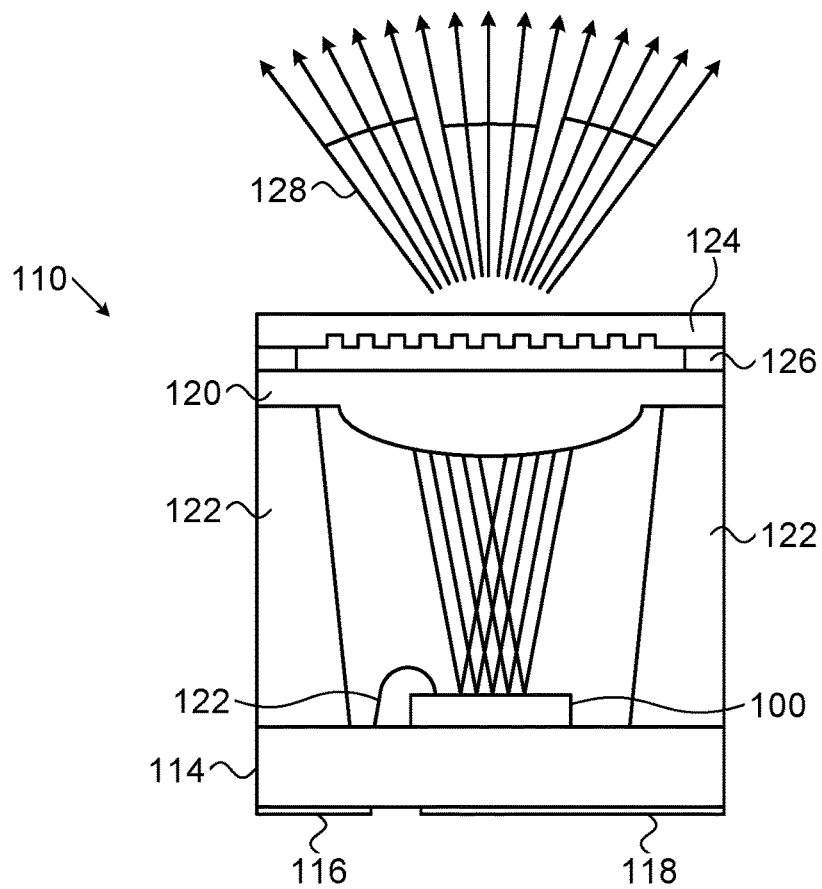
FIGS. 9A-9C are schematic side views of integrated optical projection modules, in accordance with embodiments of the present invention.
Figure 9B:
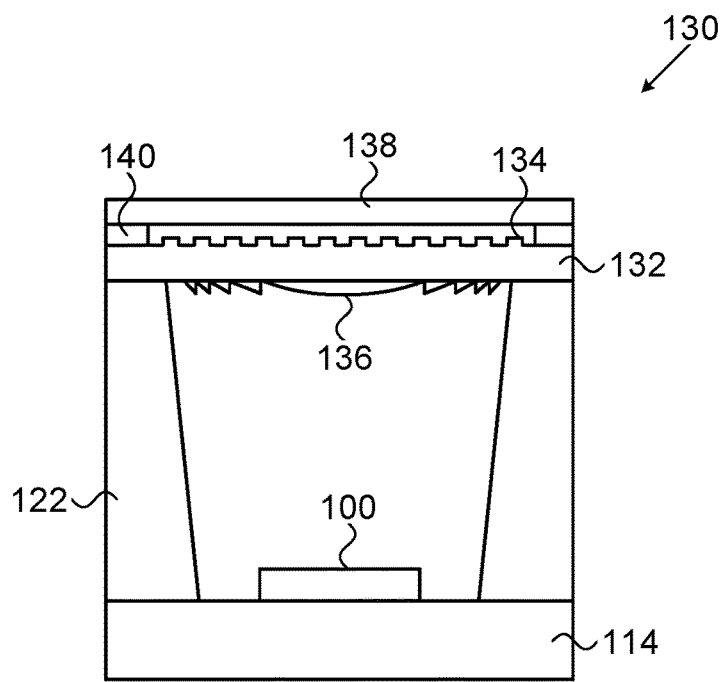
Figure 9C:
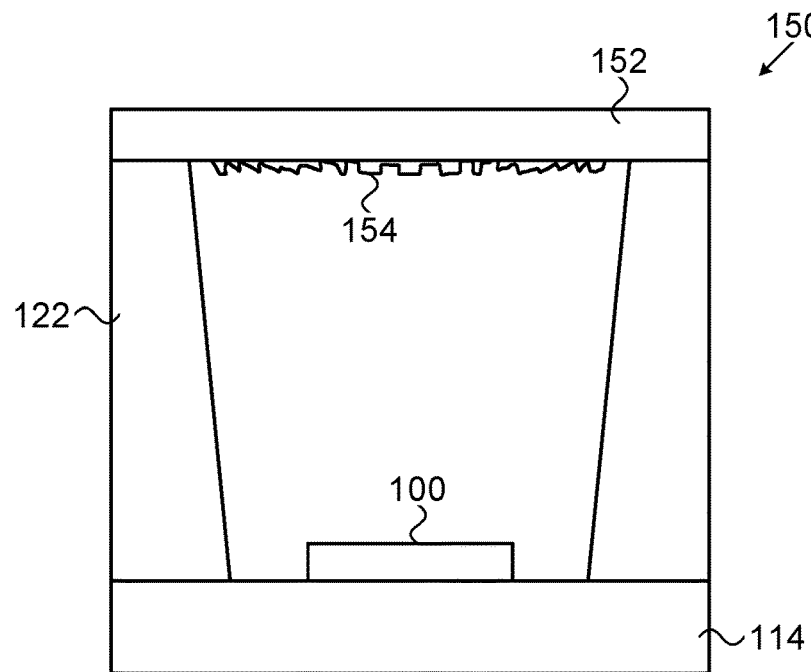

Although FIGS. 3A and 3B illustrate the use of a DOE field multiplier in conjunction with a particular beam source configurations, such DOEs may similarly be used in other projection assemblies, using other sorts of beam sources. Some examples are shown in FIGS. 9A-9C and are described below.

Refractive Field Multipliers

Figure 4A:
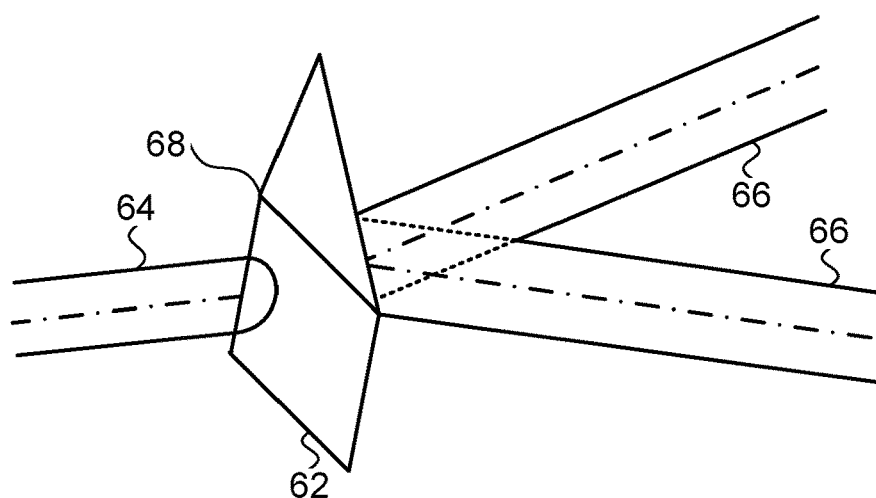
FIG. 4A is a schematic, pictorial illustration of a field multiplier prism, in accordance with an embodiment of the present invention.
Figure 4B:
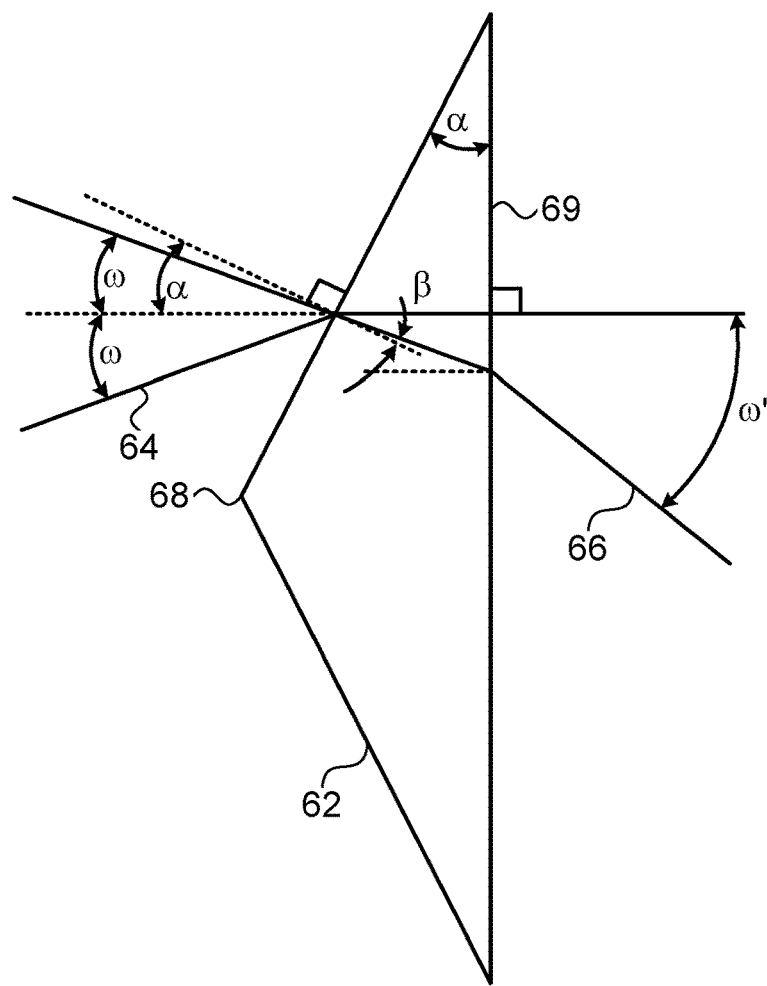
FIG. 4B is a schematic, geometrical representation of the prism of FIG. 4A.

FIGS. 4A and 4B schematically illustrate a field multiplier prism 62, in accordance with an embodiment of the present invention. FIG. 4A is a pictorial illustration, while FIG. 4B is a geometrical representation of the prism. Prism 62 may be used as field multiplier 36 in place of the DOE described above in the configurations of projection assembly 30 that are shown in FIGS. 3A and 3B, for example.

Prism 62 has a triangular profile, typically an isosceles triangle, with an edge 68 that is positioned so that an optical beam 64 projected by projection lens 54 is incident on the edge and thus on the angled prism faces on both sides of the edge. The prism generates two output sub-beams 66, which pass out through a base 69 of the prism (opposite edge 68) with a total FOV that is expanded by as much as a factor of two in the direction perpendicular to edge 68. The amount of field multiplication is a function of the vertex angle at edge 68, which is typically greater than 90°, as illustrated in the figures.

As shown in FIG. 4B, the FOV angle $\omega'$ of output sub-beams 66 is a function of the input FOV $\omega$, the prism angle $\alpha$, and the corresponding angular refraction parameter $\beta$. The relation between these parameters may be calculated using Snell's law:

$$n \sin \alpha = \sin(\alpha + \omega) \quad (1)$$

$$n \sin \beta = \sin(\alpha - \omega) \quad (2)$$

$$\sin \omega' = n \sin(\alpha - \beta) \quad (3)$$

Figure 4C:
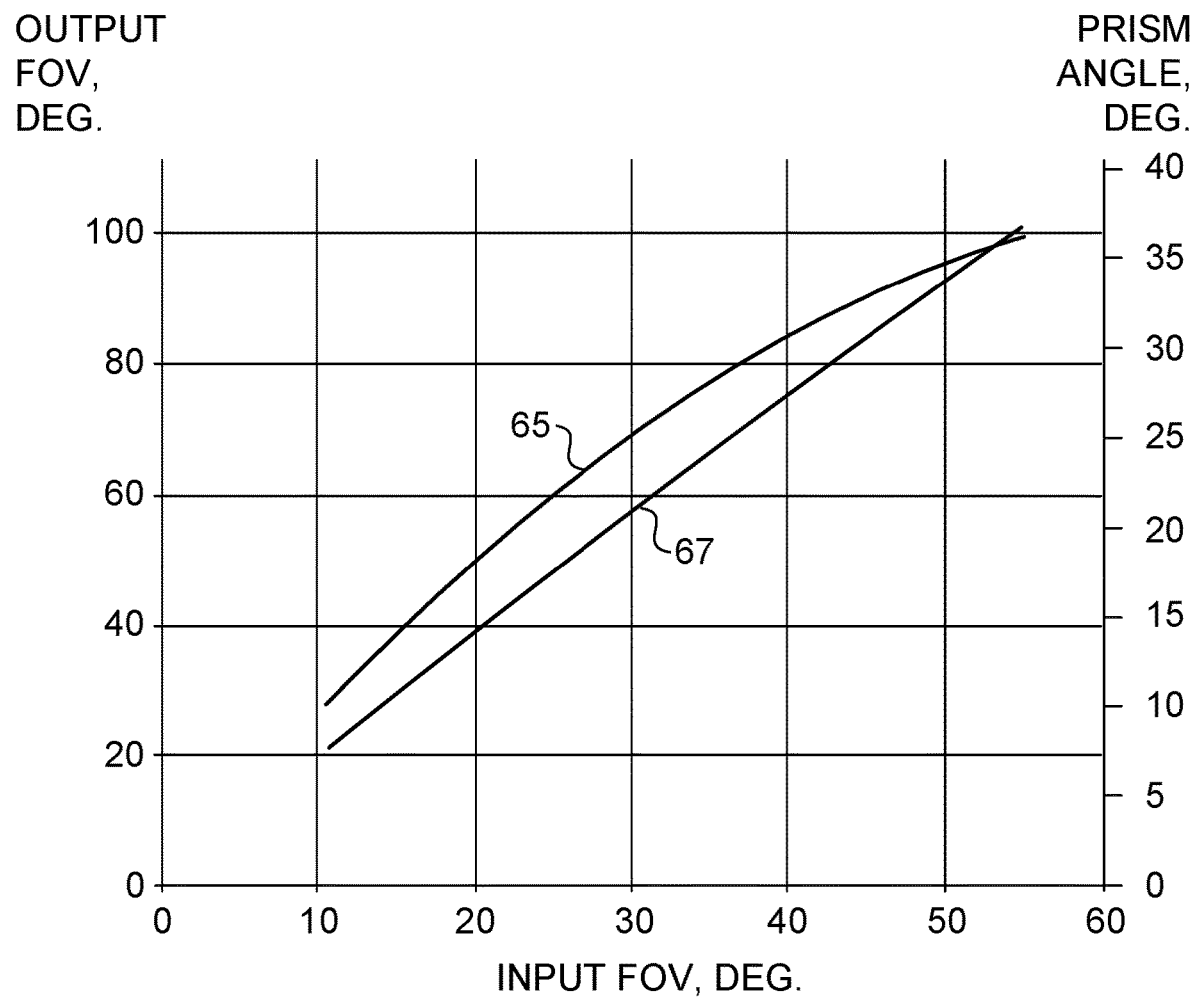
FIG. 4C is a schematic plot showing angular characteristics of a field multiplier prism, in accordance with an embodiment of the present invention.

FIG. 4C is a schematic plot containing a curve 65 showing the optimal prism angle $\alpha$ and a curve 67 showing the output FOV full angle $2\omega'$ as a function of the input FOV full angle $2\omega$ for prism 62, in accordance with an embodiment of the present invention. In calculating this plot, based on the above formulas, it was assumed that prism 62 comprises glass with a refractive index of 1.52. With appropriate choice of the prism angle, prism 62 is capable of roughly doubling the FOV of the pattern projected by lens 54.

Figure 5:
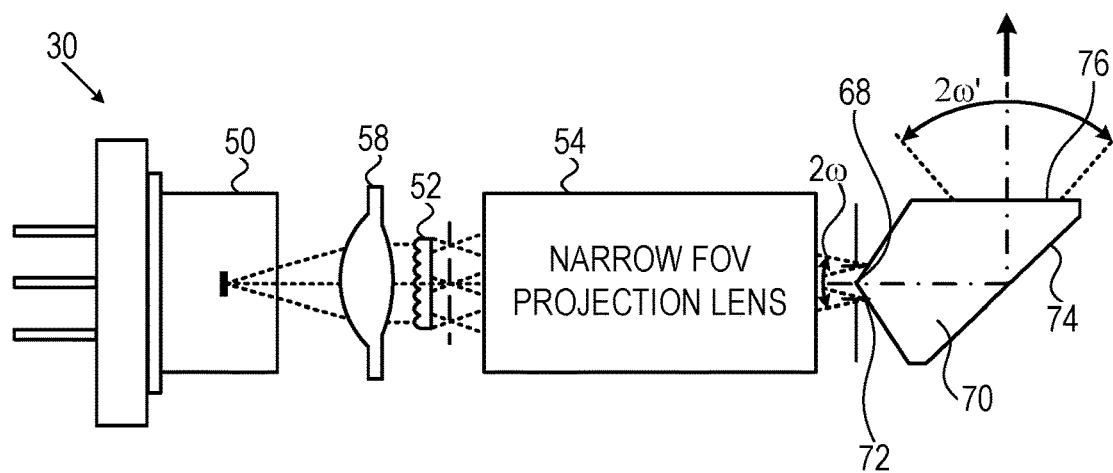
FIG. 5 is a schematic side view of a projection assembly, in accordance with an embodiment of the present invention.

FIG. 5 is a schematic side view of projection assembly 30, in accordance with another embodiment of the present invention, in which a prism 70 functions as both field multiplier 36 and beam folder 56. An edge 72 of prism 70 is positioned in the exit pupil of projection lens 54 and serves to multiply the FOV angle as described above. In addition, the prism comprises an internal reflective surface 74, which folds the projected optical beam. Thus the projected beam exits prism 70 through an exit face 76, at right angles to the optical axis of the projection assembly.

Figure 6:
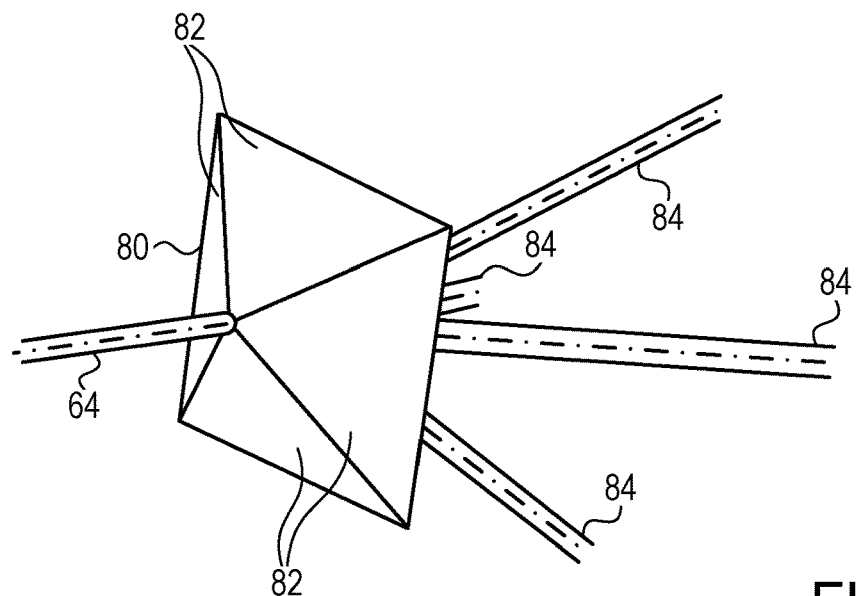
FIGS. 6 and 7 are schematic, pictorial illustrations of field multiplier prisms, in accordance with embodiments of the present invention.

FIG. 6 is a schematic, pictorial illustration of a field multiplier prism 80, which may be used as the field multiplier in projection assembly 30 in accordance with another embodiment of the present invention. Prism 80 has a pyramidal shape with four faces meeting at an apex 86. Prism 80 is positioned so that optical beam 64 projected by projection lens 54 is incident on the apex. Thus, prism 80 generates four output sub-beams 84, which expand the FOV of the projected beam in both horizontal and vertical dimensions (as opposed to the embodiment of FIGS. 4A and 4B, which expands the beam in only a single dimension). An internal folding surface may be added to prism 80 as in prism 70 (FIG. 5).

Figure 7:
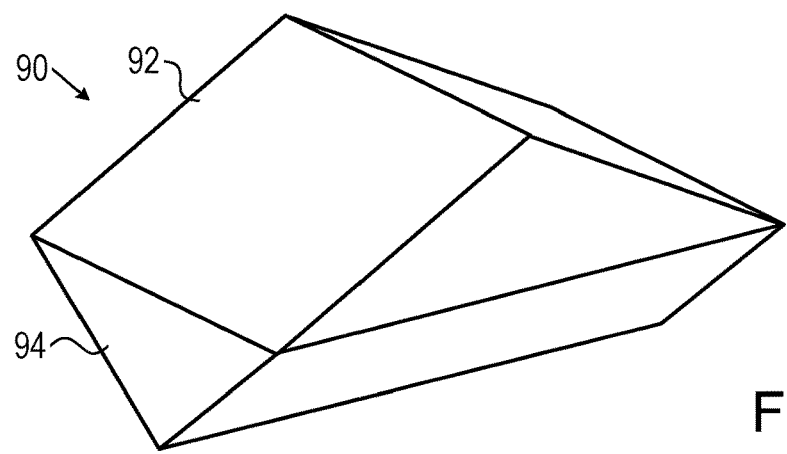

FIG. 7 is a schematic, pictorial illustration of a field multiplier 90, in accordance with an alternative embodiment of the present invention. Field multiplier 90 comprises two prisms 92, 94, which are similar in shape to prism 62. Prisms 92 and 94 are joined at their respective bases and are rotated relative to one another so that the edges of the two prisms that are opposite the bases are mutually perpendicular. Thus, the edge of prism 92 expands the FOV of an incident projected beam in one dimension, while the edge of prism 94 expands the beam in the other direction.

Integrated Pattern Generators

VCSEL arrays can be used advantageously in producing compact, high-intensity light sources and projectors. In conventional VCSEL arrays, the laser diodes are arranged in a regular lattice, such as a rectilinear grid pattern as described in the above-mentioned U.S. Patent Application Publication 2011/0188054, for example, or a hexagonal lattice pattern. The term "regular lattice," as used in the context of the present description and in the claims, means a two-dimensional pattern in which the spacing between adjacent elements in the pattern (for example, between adjacent emitters in a VCSEL array) is constant. The term "regular lattice" in the sense is synonymous with a periodic lattice.

Embodiments of the present invention that are described hereinbelow depart from this model and instead provide VCSEL arrays in which the laser diodes are arranged in a pattern that is not a regular lattice. Optics may be coupled to project the pattern of light emitted by the elements of the VCSEL array into space as a pattern of corresponding spots, wherein each spot contains the light emitted by a corresponding laser diode in the array. Typically (although not necessarily), the pattern of laser diode locations in the array, and hence the pattern of spots, is uncorrelated, in the sense that the auto-correlation of the positions of the laser diodes as a function of transverse shift is insignificant for any shift larger than the diode size. Random, pseudo-random, and quasi-periodic patterns are examples of such uncorrelated patterns. The projected light pattern will thus be uncorrelated, as well.

Patterned VCSEL arrays of this sort are particularly useful in producing integrated pattern projection modules, as described below. Such modules have the advantages of simplicity of design and production and can achieve cost and size reduction, as well as better performance, in comparison with projection devices that are known in the art.

Figure 8:
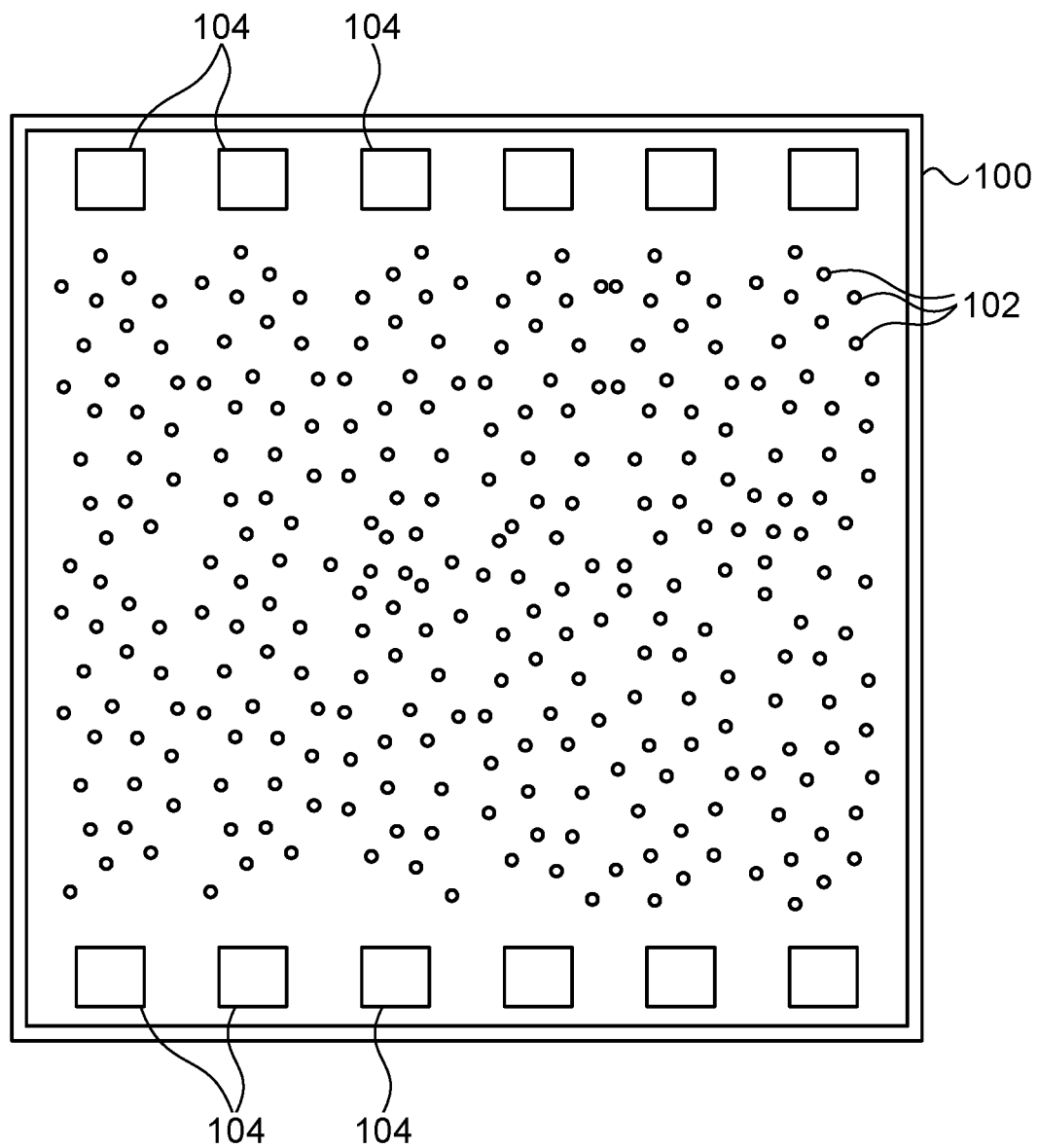
FIG. 8 is a schematic top view of a semiconductor die on which a patterned emitter array has been formed, in accordance with an embodiment of the present invention.

FIG. 8 is a schematic top view of an optoelectronic device comprising a semiconductor die 100 on which a monolithic array of VCSEL diodes 102 has been formed in a two-dimensional pattern that is not a regular lattice, in accordance with an embodiment of the present invention. The array is formed on the semiconductor substrate by the same sort of photolithographic methods as are used to produce VCSEL arrays that are known in the art, with suitable thin film layer structures forming the laser diodes and conductors providing electric power and ground connections from contact pads 104 to laser diodes 102 in the array.

The non-regular lattice arrangement of FIG. 8 is achieved simply by appropriate design of the photolithographic masks that are used to produce the array, in any desired two-dimensional pattern. Alternatively, non-regular arrays of other sorts of surface-emitting elements, such as light-emitting diodes (LEDs), may similarly be produced in this manner (although incoherent light sources, such as LEDs, may be less suitable in some pattern projection applications).

Monolithic VCSEL arrays of the sort shown in FIG. 8 have the advantage of high power scalability. For example, using current technology, a die with an active area of 0.3 mm² can contain 200 emitters, with a total optical power output of about 500 mW or more. The VCSEL diodes emit circular beams, and may be designed to emit circular Gaussian beams with a single traverse mode, which is advantageous in creating spot patterns of high contrast and high density. Because the VCSEL emission wavelength is relatively stable as a function of temperature, the spot pattern will likewise be stable during operation, even without active cooling of the array.

FIG. 9A is a schematic side view of an integrated optical projection module 110 containing a VCSEL array, such as the array shown in FIG. 8, in accordance with an embodiment of the present invention. VCSEL die 100 is typically tested at wafer level, and is then diced and mounted on a suitable sub-mount 114 with appropriate electrical connections 116, 118. The electrical connections, and possibly control circuits (not shown), as well, may be coupled to die 100 by wire bonding conductors 122.

A lens 120, mounted over the die on suitable spacers 122, collects and projects the output beams of the VCSEL emitters. For temperature stability, a glass lens may be used. A diffractive optical element (DOE) 124, positioned by spacers 126, creates multiple replicas 128 of the pattern, fanning out over an expanded angular range. The DOE may, for example, comprise a Damman grating or a similar element, as described in the above-mentioned U.S. Patent Application Publications 2009/0185274 and 2010/0284082.

Figure 10A:
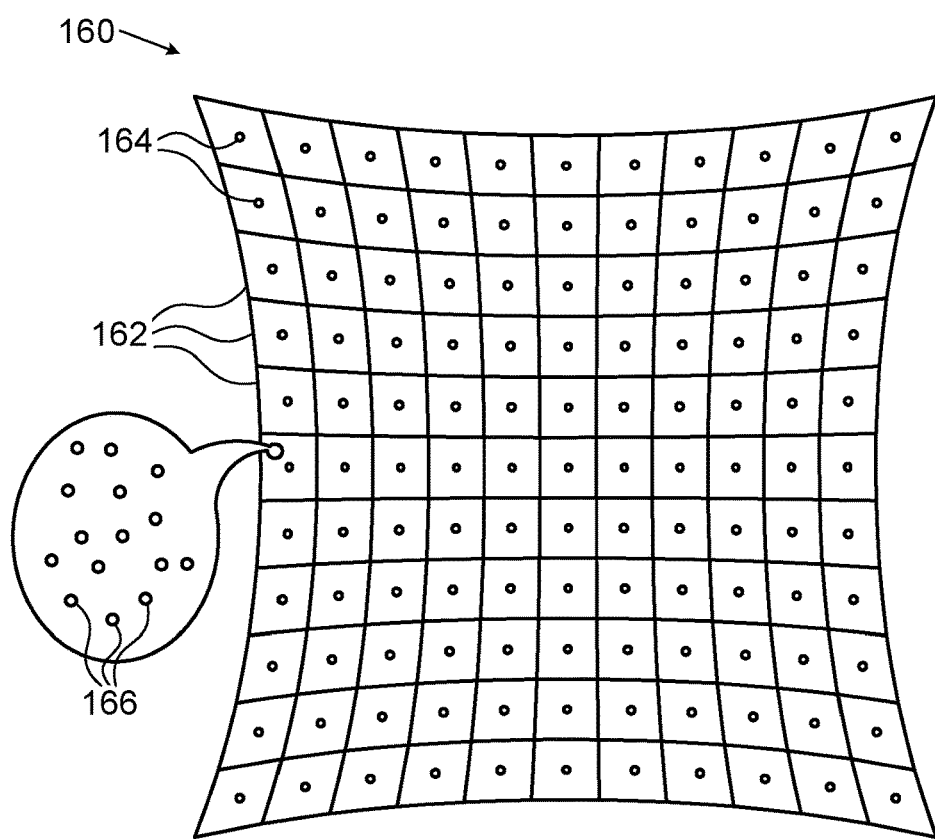
FIGS. 10A and 10B are schematic frontal views of patterns projected by optical projection modules in accordance with embodiments of the present invention.

FIG. 10A is a schematic frontal view of an expanded pattern 160 projected by optical projection module 110, in accordance with an embodiment of the present invention. This figure shows the sort of fan-out pattern that is created by DOE 124. The DOE in this example expands the projected beam into an array of 11×11 tiles 162, centered on respective axes 164, although larger or smaller numbers of tiles may alternatively be produced. Each tile 162 (which has the shape of a distorted square, due to pincushion distortion) in FIG. 10A contains a pattern of bright spots 166, which is a replica of the pattern of the VCSEL array.

Typically, the fan-out angle between adjacent tiles 162 in this example is in the range of 4-8°. Assuming each such tile contains, for example, approximately 200 spots in an uncorrelated pattern, corresponding to the approximately 200 laser diodes 102 in the VCSEL array, the 11×11 fan-out pattern 160 that is shown in FIG. 10A will then contain more than 20,000 spots. DOE 124 is designed so that the projected replicas of the pattern tile a surface or region of space, as described, for example, in U.S. Patent Application Publication 2010/0284082.

FIG. 9B is a schematic side view of an integrated optical projection module 130 containing a non-regular VCSEL array, such as the array shown in FIG. 8, in accordance with an alternative embodiment of the present invention. In this embodiment, the refractive projection lens 120 of module 110 is replaced by a diffractive lens 130. Lens 130 and a fan-out DOE 134 (similar to DOE 124) may be formed on opposite sides of the same optical substrate 132. Although diffractive lenses are sensitive to wavelength variations, the relative stability of the wavelength of the VCSEL elements makes this approach feasible. DOE 134 is protected by a window 138, which is mounted on spacers 140.

FIG. 9C is a schematic side view of an integrated optical projection module 150 containing a non-regular VCSEL array, in accordance with yet another embodiment of the present invention. Here the functions of the diffractive lens and fan-out DOE are combined in a single diffractive element 154, formed on an optical substrate 152, which also serves as the window. Element 154 performs both focusing and fan-out functions: It collects and focuses light emitted by the light-emitting elements on die 100 so as to project an optical beam containing a light pattern corresponding to the two-dimensional pattern of the light-emitting elements on the substrate, while expanding the projected optical beam by producing multiple, mutually-adjacent replicas of the pattern as shown above.

During assembly of the modules shown in FIGS. 9A-C, the DOE is typically aligned in four dimensions (X, Y, Z and rotation) relative to VCSEL die 100. The embodiments of 9B and 9C may be advantageous in terms of alignment, since the photolithographic processes that are used to produce both the VCSEL array and the DOE/diffractive lens structure are accurate to about 1 μm, thus permitting passive alignment in X, Y and rotation simply by matching fiducial marks. Z-alignment (i.e., the distance between the VCSEL die and the DOE and lens) requires only a small range of motion, due to the high accuracy of production. Z-alignment may thus be accomplished either actively, while the VCSEL array is under power, or possibly passively, using a height-measuring device, such as a confocal microscope, for example, to measure the distance between the VCSEL surface and DOE surface.

The modules of FIGS. 9A-C may be used as pattern projectors in 3D mapping system 20. The tiled pattern (as illustrated in FIG. 10A, for example) is projected onto an object of interest, and imaging module 32 captures an image of the pattern on object 28. As explained earlier, a processor associated with the imaging module measures the local transverse shift of the pattern, relative to a known reference, at each point in the image and thus finds the depth coordinate of that point by triangulation based on the local shift.

Each replica of the pattern, corresponding to one of tiles 162 in FIG. 10A, is internally uncorrelated but is typically highly correlated with the neighboring tiles. Because each replica of the pattern contains a relatively small number of spots 166, distributed over a relatively small angular range, there is a possibility of ambiguity in the depth coordinates when the transverse shifts of the pattern on the object are on the order of or larger than the pitch of tiles 162. To reduce this ambiguity, VCSEL die 100 may be produced with a larger number of laser diodes, and the optics of the projection module may thus produce larger tiles; but this solution increases the complexity and cost of both the VCSEL die and the optics.

Figure 10B:
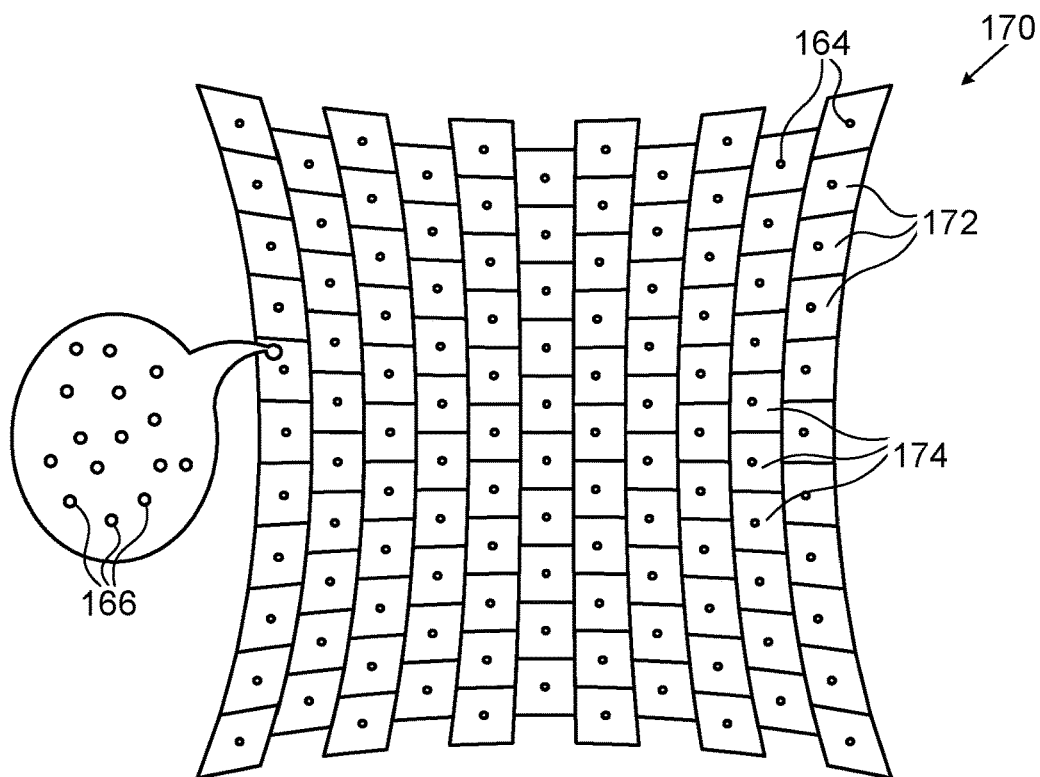

FIG. 10B is a schematic frontal view of an expanded pattern 170 projected by an optical projection module, in accordance with an alternative embodiment of the present invention that addresses the issue of correlation between neighboring tiles. (The DOE-based field multipliers of FIGS. 3A and 3B may similarly be configured to produce patterns like pattern 160 or 170.) The sort of interleaved tiled pattern that is shown in FIG. 10B is produced by suitable design of the fan-out DOE. In this design, at least some of the tiles in the pattern are offset transversely relative to neighboring tiles by an offset that is a fraction of the pitch. Specifically, in this example, tiles 172 are offset transversely by half a tile relative to neighboring tiles 174. (The offset is in the vertical direction in this example, on the assumption that only horizontal transverse shift is used in the depth measurement).

As a result of this offset between tiles, the range of unambiguous depth measurement is effectively doubled. Other interleavings, in which adjacent tiles are shifted by ⅓ or ¼ of the tile pitch, for instance, can provide even larger ranges of unambiguous measurement. DOEs giving these and other fan-out patterns may be designed using methods known in the art, such as methods based on the Gerchberg-Saxton algorithm.

Figure 11:
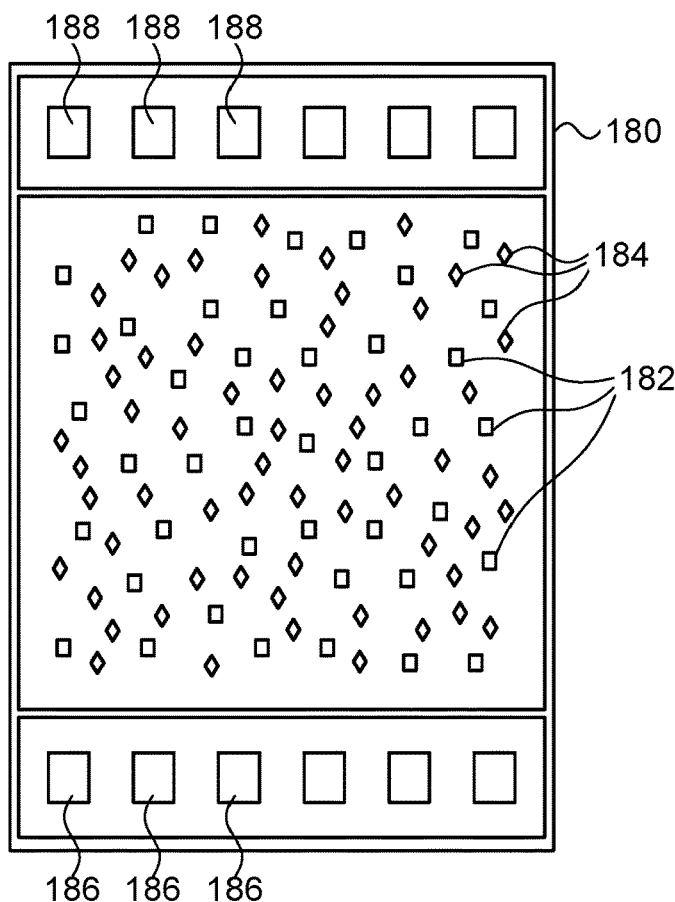
FIG. 11 is a schematic top view of a semiconductor die on which a patterned emitter array has been formed, in accordance with an alternative embodiment of the present invention.

FIG. 11 is a schematic top view of a semiconductor die 180 on which a monolithic VCSEL array has been formed, in accordance with another embodiment of the present invention. This array is similar to the array of FIG. 8, except that in the embodiment of FIG. 11 there are two groups of VCSEL diodes 182 and 184, which are driven by separate conductors 186 and 188. Diodes 182 and 184 are shown in the figure as having different shapes, but this shape differentiation is solely for the sake of visual clarity, and in fact, all of the VCSEL diodes in both groups typically have the same shape.

The two groups of VCSEL diodes 182 and 184 that are shown in the figure may be used, in conjunction with a high-resolution image sensor 42 in imaging module 32 (FIG. 1), to implement a zoom function in depth mapping system 20. The separate power lines feeding the two groups may be implemented either by providing separate power traces to the two groups within a single metal layer of the VCSEL die, or by adding a metal layer, so that each group is fed by a different layer. The two groups may contain the same or different numbers of diodes, depending on the desired performance characteristics of the system. The image sensor is assumed to support binning of neighboring detector elements (which provides enhanced sensitivity and speed at the cost of reduced resolution), cropping of the sensing area, and adjustable clock rate. These features are offered by various commercially-available image sensors.

In wide-angle mode, one of the two groups of VCSEL diodes (for example, diodes 182) receives power, while the other group is shut off. As a result, the group that is powered on may be driven at high power, to increase the brightness of the individual spots in the pattern, without exceeding the overall power rating of the VCSEL die. (Higher power per emitter is possible because of the increased distance between the active neighboring emitters in this mode, which reduces the associated heating effect.) Meanwhile, image sensor 42 operates in binning mode, and thus forms a low-resolution image of the entire field of view of the system. Because the detector elements of the image sensor are binned, the image sensor can capture and output the image at high speed. The processor measures the transverse shifts of the pattern in this image in order to generate an initial low-resolution depth map.

The processor may segment and analyze the low-resolution depth map in order to recognize objects of potential interest, such as a human body, within the field of view. At this stage, the processor may choose to zoom in on an object of interest. For this purpose, the processor turns on all of VCSEL diodes 182 and 184, in both groups, in order to generate a high-resolution pattern. The processor also instructs image sensor 42 to operate in cropping mode so as to scan only the area within the field of view in which the object of interest was found. The image sensor at this stage is typically read out at full resolution (within the cropped area), without binning, and is thus able to capture a high-resolution image of the high-resolution pattern. Due to the cropping of the readout area, the image sensor is able to output the image at high speed in the high-resolution mode, as well. The processor now measures the transverse shifts of the pattern in this latter image in order to form a high-resolution depth map of the object of interest.

The embodiment described above makes optimal use of both the power resources of the VCSEL-based pattern projector and the detection resources of the image sensor. In both the wide-angle and zoom modes, the scanning speed and sensitivity of the of the image sensor can be adjusted (by binning, cropping, and clock rate adjustment) to provide depth maps of the appropriate resolution, typically at a constant frame rate, such as 30 frames/sec.

Although some of the above embodiments refer specifically to pattern-based 3D mapping, the pattern projectors described above may similarly be used in other applications, including both 2D and 3D imaging applications, that use patterned light. It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic device, comprising:
    a semiconductor substrate; and
    a monolithic array of light-emitting elements, arranged on the substrate in a two-dimensional pattern that is not a regular lattice,
    wherein the two-dimensional pattern of the light-emitting elements is an uncorrelated pattern.

2. The device according to claim 1, wherein the light-emitting elements comprise vertical-cavity surface-emitting laser (VCSEL) diodes.

3. The device according to claim 1, and comprising a projection lens, which is mounted on the semiconductor substrate and is configured to collect and focus light emitted by the light-emitting elements so as to project an optical beam containing a light pattern corresponding to the two-dimensional pattern of the light-emitting elements on the substrate.

4. The device according to claim 1, and comprising:
a projection lens, which is configured to collect and focus light emitted by the light-emitting elements so as to project an optical beam containing a light pattern corresponding to the two-dimensional pattern of the light-emitting elements onto a surface of an object; and
an imaging assembly, which is configured to capture an image of the projected light pattern on the surface and to process the image so as to derive a 3D map of the surface.

5. A method for producing an optoelectronic device, the method comprising:
providing a semiconductor substrate; and
forming a monolithic array of light-emitting elements on the substrate in a two-dimensional pattern that is not a regular lattice,
wherein the two-dimensional pattern of the light-emitting elements is an uncorrelated pattern.

6. The method according to claim 5, wherein the light-emitting elements comprise vertical-cavity surface-emitting laser (VCSEL) diodes.

7. The method according to claim 5, wherein forming the monolithic array comprises forming first and second sets of the light-emitting elements, wherein the first and second sets are interleaved on the substrate in respective first and second patterns, and
wherein the method comprises separately driving the first and second sets of the light-emitting elements so that the device selectably emits light in either or both of the first and second patterns.

8. The method according to claim 7, and comprising:
projecting the light emitted by the light emitting elements onto an object;
capturing first images of the object in a low-resolution mode while only the first set of the light-emitting elements is driven to emit the light, thereby projecting a low-resolution pattern onto the object; and
capturing second images in a high-resolution mode while both of the first and second sets of the light-emitting elements are driven to emit the light, thereby projecting a high-resolution pattern onto the object.

9. The method according to claim 5, and comprising mounting a projection lens on the semiconductor substrate so as to collect and focus light emitted by the light-emitting elements, thereby projecting an optical beam containing a light pattern corresponding to the two-dimensional pattern of the light-emitting elements on the substrate.

10. The method according to claim 5, and comprising:
collecting and focusing light emitted by the light-emitting elements so as to project an optical beam containing a light pattern corresponding to the two-dimensional pattern of the light-emitting elements onto a surface of an object;
capturing an image of the projected light pattern on the surface; and
processing the image so as to derive a 3D map of the surface.

11. An optoelectronic device, comprising:
a semiconductor substrate;
a monolithic array of light-emitting elements, arranged on the substrate in a two-dimensional pattern; and
a projection lens, which is mounted on the semiconductor substrate and is configured to collect and focus light emitted by the light-emitting elements so as to project an optical beam containing a light pattern corresponding to the two-dimensional pattern of the light-emitting elements on the substrate.

12. The device according to claim 11, and comprising a diffractive optical element (DOE), which is mounted on the substrate and is configured to expand the projected optical beam by producing multiple, mutually-adjacent replicas of the pattern.

13. The device according to claim 12, wherein the projection lens and the DOE are formed on opposing sides of a single optical substrate.

14. The device according to claim 11, wherein the projection lens comprises a diffractive lens.

15. The device according to claim 11, wherein the projection lens is configured to project the light pattern onto a surface of an object, and wherein the apparatus comprises an imaging assembly, which is configured to capture an image of the projected light pattern on the surface and to process the image so as to derive a 3D map of the surface.

16. A method for producing an optoelectronic device, the method comprising:
providing a semiconductor substrate;
forming a monolithic array of light-emitting elements on the substrate in a two-dimensional pattern; and
mounting a projection lens on the semiconductor substrate so as to collect and focus light emitted by the light-emitting elements, thereby projecting an optical beam containing a light pattern corresponding to the two-dimensional pattern of the light-emitting elements on the substrate.

17. The method according to claim 16, and comprising mounting a diffractive optical element (DOE) on the substrate so as to expand the projected optical beam by producing multiple, mutually-adjacent replicas of the pattern.

18. The method according to claim 17, wherein the projection lens and the DOE are formed on opposing sides of a single optical substrate.

19. The method according to claim 16, wherein the projection lens comprises a diffractive lens.

20. The method according to claim 16, wherein projecting the optical beam comprises projecting the light pattern onto a surface of an object, and wherein the method comprises capturing an image of the projected light pattern on the surface, and processing the image so as to derive a 3D map of the surface.

* * * * *